(12) United States Patent  
Aoki

(10) Patent No.: US 7,859,030 B2
(45) Date of Patent: Dec. 28, 2010

(54) HETEROJUNCTION BIPOLAR TRANSISTOR AND FABRICATION METHOD OF THE SAME

(75) Inventor: Shigetaka Aoki, Osaka (JP)

(73) Assignee: Panasonic Corporation, Osaka (JP)

( * ) Notice: Subject to any disclaimer, the term of this patent is extended or adjusted under 35 U.S.C. 154(b) by 848 days.

(21) Appl. No.: 11/706,338

(22) Filed: Feb. 15, 2007

(65) Prior Publication Data

US 2007/0215979 A1    Sep. 20, 2007

(30) Foreign Application Priority Data

Mar. 16, 2006   (JP) .............................. 2006-073381

(51) Int. Cl.
  *H01L 29/66* (2006.01)
(52) U.S. Cl. .............................. 257/289; 257/E27.053
(58) Field of Classification Search .................. 257/592, 257/E27.053
  See application file for complete search history.

(56) References Cited

U.S. PATENT DOCUMENTS

2003/0170960 A1* 9/2003 Jagannathan et al. ........ 438/312

2005/0116226 A1* 6/2005 Von Kanel .................... 257/65

FOREIGN PATENT DOCUMENTS

| JP | 2-504205 | 11/1990 |
|---|---|---|
| JP | 2001-332563 | 11/2001 |
| JP | 2002-313798 | 10/2002 |
| WO | WO 88/08206 | 10/1988 |

* cited by examiner

*Primary Examiner*—Bradley K Smith
*Assistant Examiner*—Amar Movva
(74) *Attorney, Agent, or Firm*—McDermott Will & Emery LLP

(57) ABSTRACT

A SiGe-HBT having a base region made of SiGe mixed crystal. The base region includes: an intrinsic base region having junctions with a collector region and an emitter region; and an external base region for connecting the intrinsic base region with a base electrode. The intrinsic base region and the external base region are doped with a first impurity of a given conductivity type. The external base region is further doped with a second impurity. As the first impurity, an element smaller in atomic radius than Si (such as boron, for example) is selected, and as the second impurity, an element larger in atomic radius than the first impurity (such as Ge, In and Ga, for example) is selected.

8 Claims, 5 Drawing Sheets

US 7,859,030 B2

HETEROJUNCTION BIPOLAR TRANSISTOR AND FABRICATION METHOD OF THE SAME

CROSS-REFERENCE TO RELATED APPLICATIONS

This application claims priority under 35 U.S.C. §119 on Patent Application No. 2006-073381 filed in Japan on Mar. 16, 2006, the entire contents of which are hereby incorporated by reference.

BACKGROUND OF THE INVENTION

The present invention relates to a bipolar transistor, and more particularly to a heterojunction bipolar transistor using SiGe for its base region, and a fabrication method for the same.

In a heterojunction bipolar transistor (HBT), by forming the base region using SiGe mixed crystal that is narrower in band gap than the emitter region, it is possible to suppress holes from entering the emitter region from the base region even if the base region is doped with a highly-concentrated impurity. Therefore, the base resistance can be reduced while the current amplification ($h_{FE}$) is secured, and thus the HBT can operate at higher speed than a normal Si bipolar transistor.

Such a SiGe-HBT also has an effect that the carrier mobility increases because of lattice distortion existing in a SiGe layer that is to be the base region. This can shorten the travel time of carriers through the base and thus permits further higher-speed operation (see Japanese National Phase PCT Laid-Open Publication No. 02-504205).

Although only an intrinsic base region located immediately below the emitter region is necessary for a HBT to perform transistor operation, an external base region must be provided in adjacent to the intrinsic base region to secure contact with a base electrode. An overlap portion of the external base region and the collector region however forms an external base-collector parasitic capacitance, and with such a parasitic capacitance, sufficient speedup fails even if the area of the emitter region is reduced.

A SiGe-HBT using polysilicon as extraction electrodes shown in FIG. 6 may well be said to have a transistor structure suitable for speedup because it is easy to reduce the parasitic capacitance by miniaturization (see Japanese Laid-Open Patent Publication No. 2001-332563, for example).

Referring to FIG. 6, on a collector region 101 formed inside a Si substrate, formed is an intrinsic base region 103 made of SiGe mixed crystal doped with boron (B) as a p-type impurity grown by selective epitaxy.

An emitter region 106 is formed inside the intrinsic base region 103, and an emitter extraction electrode (emitter polysilicon electrode) 108 doped with phosphorus (P) as an n-type impurity is formed for connecting the emitter region 106 with a metal interconnection 111. The emitter region 106 is formed by first forming the emitter polysilicon electrode 108 and heat-treating the emitter polysilicon electrode 108 to allow phosphorus therein to diffuse into the base region 103. If the emitter region 106 is formed by ion implantation, boron may diffuse at an accelerated speed due to release of interstitial silicon during activation annealing, causing a problem of degrading a high-frequency characteristic. By using the doped emitter polysilicon electrode as described above, such accelerated-speed diffusion of boron can be prevented.

An external base region 104 and a base extraction electrode 105, which are formed simultaneously with the intrinsic base region 103, are doped with highly-concentrated boron by ion implantation in a self-alignment manner using the emitter polysilicon electrode 108 as a mask. With this doping, the distance of the intrinsic base region 103 between the emitter region 106 and the external base region 104 can be shortened to thereby reduce the base resistance. Also, because the base extraction electrode (base polysilicon electrode) 105 is formed on an isolation region 102, the parasitic capacitance between the external base region and the collector can be reduced.

In the transistor structure shown in FIG. 6, to electrically isolate the emitter polysilicon electrode 108 from the base polysilicon electrode 105, an insulation film 107 such as an oxide film and a nitride film is formed between the emitter polysilicon electrode 108 and the base polysilicon electrode 105. Also, to reduce the contact resistance against the metal interconnection 111, a silicide film 109 such as cobalt (Co) silicide is formed on the surfaces of the emitter polysilicon electrode 108 and the base polysilicon electrode 105, and is connected with the metal interconnection 111 via a contact hole 110 filled with tungsten (W) and the like.

As described above, in the SiGe-HBT using polysilicon as extraction electrodes, the parasitic capacitance/resistance can be easily reduced by miniaturization, and thus such a SiGe-HBT can well be said to have a transistor structure suitable for speedup. However, if the concentration of boron ion-implanted in the external base region 104 is $5E19 cm^{-3}$ or higher, for example, boron will diffuse at an accelerated speed due to release of interstitial silicon during activation annealing, causing problems of reduction in $h_{FE}$ and early voltage and degradation in high-frequency characteristic.

A raised base structure shown in FIG. 7 provides an effective means for preventing the accelerated-speed diffusion of boron in an external base region 104 (see Japanese Laid-Open Patent Publication No. 2002-313798, for example).

As shown in FIG. 7, a polysilicon film 107 doped with boron as a p-type impurity is formed on the external base region 104 that is a SiGe epitaxial layer formed on the collector region 101 and an isolation region 102 (the portion of the region 104 on the isolation region 102 is a polysilicon layer). Boron diffuses from the doped polysilicon film 107 into the external base region 104 to give the highly-concentrated external base region 104. In this way, by using the doped polysilicon film 107 as a diffusion source for the external base region 104, the accelerated-speed diffusion of boron in the external base region 104 is prevented.

SUMMARY OF THE INVENTION

In the SiGe-HBT using polysilicon as extraction electrodes, the parasitic capacitance amount can be reduced by miniaturization. Also, the accelerated-speed diffusion of boron can be prevented by adopting the doping method using the doped polysilicon film in formation of the emitter region and attainment of the highly-concentrated external base region. This is therefore a technology superior in the pursuit of speedup of bipolar transistors.

Focusing attention on this superiority, the inventor of the present invention developed SiGe-HBTs using polysilicon as extraction electrodes and made various examinations on the device structure, the process conditions and the like.

In the evaluation of the device characteristics obtained from the examinations, however, the present inventor noticed that the speedup that should accompany the increase in carrier mobility, which is an effect inherent in SiGe-HBTs, often failed to be exhibited as predicted.

In the SiGe-HBT using SiGe mixed crystal formed on Si as the intrinsic base layer as described above, lattice distortion (vertically distorted state) exists in the intrinsic base region as shown in a part (a) of FIG. 1. Distorted SiGe is smaller in band gap and thus should be greater in carrier mobility than undistorted (bulked) SiGe.

However, in the case that the external base region is doped with boron as a p-type impurity, if the boron doping concentration of the external base region is high, boron will replace lattice positions of the SiGe mixed crystal, presumably resulting in reduction in the lattice constant of the SiGe mixed crystal, because the atomic radius of boron is smaller than that of Si constituting the external base region (although the external base region is actually composed of SiGe mixed crystal, it may be regarded as being composed of Si crystallographically since the proportion of Si in the SiGe is great).

The present inventor noticed that when the reduction in the lattice constant of the SiGe mixed crystal in the external base region became evident with the highly-concentrated boron doping, the external base region might possibly exert tensile stress on the intrinsic base region that was not doped with boron in high concentration.

If the external base region exerts tensile stress on the intrinsic base region for the above reason, the lattice distortion amount in the intrinsic base region will decrease as shown in a part (b) of FIG. 1, resulting in loss of the effect inherent in the SiGe-HBT that the carrier mobility increases.

To verify the above, the present inventor prepared samples of SiGe layer ($Si_{0.79}Ge_{0.21}$) grown on the Si (100) plane by epitaxy and, while varying the boron concentration introduced in the SiGe layer, measured the change amount of the lattice constant of the SiGe layer for each of the varying boron concentrations.

FIG. 2 is a graph showing the results of the above measurement, in which the x-axis represents the boron concentration and the y-axis represents the change amount of the lattice constant. The change amount of the lattice constant of the SiGe layer was calculated from the shift amount of the SiGe peak with X-ray diffraction, and the boron concentration of the SiGe layer was measured with secondary ion mass spectroscopy (SIMS).

As shown in FIG. 2, it is found that as the boron concentration of the SiGe layer is higher, the change amount of the lattice constant of the SiGe layer is greater. The SiGe layer having a boron concentration of $5E19$ cm$^{-3}$ has changed in lattice constant by about 0.5% with respect to the non-doped SiGe layer. From this, the SiGe layer doped with boron at a concentration of $5E19$ cm$^{-3}$ or higher is expected to have experienced a change in lattice constant equal to or greater than the above change.

The present inventor have judged that the reason why the speedup accompanying the increase in carrier mobility, which is inherent in SiGe-HBTs, often fails to be attained as predicted must be that the tensile stress exerted on the intrinsic base region by the highly doped external base region causes reduction in the lattice distortion amount existing in the intrinsic base region. In the conventional SiGe-HBTs, no consideration has been made on the relationship between the lattice distortion amount existing in the intrinsic base region and the tensile stress existing in the highly doped external base region.

In view of the above, an object of the present invention is stably providing a hetero-junction bipolar transistor excellent in speedup characteristic that prevents decrease in the lattice distortion amount existing in the intrinsic region.

A measure taken by the present invention to prevent decrease in the lattice distortion amount existing in the intrinsic region is further doping the external base region, which is already doped with a highly-concentrated p-type impurity, with an impurity larger in atomic radius than the p-type impurity. That is, the decrease in lattice distortion amount is caused by the tensile stress in the external base region, and the tensile stress is produced due to the reduction in the lattice constant of the external base region doped with a p-type impurity smaller in atomic radius than Si. In consideration of these, the reduction in lattice constant may be compensated by further doping the external base region with an impurity larger in atomic radius than the p-type impurity (typically, an impurity larger in atomic radius than Si), to thereby lessen or eliminate the tensile stress. With this measure, a hetero-junction bipolar transistor excellent in speedup characteristic can be provided stably.

The heterojunction bipolar transistor of the present invention is a heterojunction bi-polar transistor having a base region made of SiGe mixed crystal, wherein the base region includes: an intrinsic base region having junctions with a collector region and an emitter region; and an external base region for connecting the intrinsic base region with a base electrode, the intrinsic base region and the external base region are doped with a first impurity of a given conductivity type, the external base region is further doped with a second impurity, and the external base region is doped with the first impurity in a higher concentration than the intrinsic base region, the first impurity is smaller in atomic radius than Si, and the second impurity is larger in atomic radius than Si.

According to the present invention, the external base region doped with the first impurity smaller in atomic radius than Si in high concentration is further doped with the second impurity larger in atomic radius than Si. By this doping, tensile stress produced in the external base region can be relaxed or eliminated. Thus, a heterojunction bipolar transistor excellent in speedup characteristic can be implemented stably without reducing the lattice distortion amount existing in the intrinsic base region.

In a preferred embodiment, the first impurity may be boron, the second impurity may be an element selected from the group consisting of Ge, In, Ga and Al, and the concentration of the first impurity introduced in the external base region may be $5E19$ cm$^{-3}$ or higher.

In another preferred embodiment, tensile stress exists on the boundary between the intrinsic base region and the external base region due to a difference between the concentrations of the first impurity introduced in the intrinsic base region and the external base region, and the tensile stress is relaxed with the second impurity introduced in the external base region.

In yet another preferred embodiment, a concentration peak of the second impurity in the external base region is roughly coincident with a concentration peak of the first impurity in the external base region. Thus, the reduction in lattice constant with the second impurity can be effectively compensated.

In yet another preferred embodiment, another concentration peak of the second impurity in the external base region is located at the boundary between the external base region and the collector region. Thus, the accelerated-speed diffusion of the first impurity with the second impurity can be effectively suppressed.

In yet another preferred embodiment, the external base region is further doped with a third impurity made of carbon. Thus, the accelerated-speed diffusion of the first impurity with carbon can be effectively suppressed.

In yet another preferred embodiment, a concentration peak of the third impurity made of carbon in the external base region is roughly coincident with a concentration peak of the first impurity in the external base region. Thus, the accelerated-speed diffusion of the first impurity with carbon can be further effectively suppressed.

In yet another preferred embodiment, the second impurity is made of Ge, the intrinsic base region is made of SiGe mixed crystal having a composition of $Si_{(1-x1)}Ge_{x1}$, and the external base region is made of SiGe mixed crystal having a composition of $Si_{(1-x2)}Ge_{x2}$ wherein x1<x2.

In yet another preferred embodiment, the first impurity is made of boron, and the Ge concentration×2 of the external base region satisfies $7.5\times(B_{ext}-B_{int})=G_{ext}-G_{int}$, where $B_{ext}$ and $B_{int}$ respectively denote the boron concentrations of the external base region and the intrinsic base region, and $G_{int}$ and $G_{ext}$ are respectively the Ge concentration of the intrinsic base region and the external base region.

Preferably, the SiGe mixed crystal includes SiGeC.

The fabrication method for a heterojunction bipolar transistor of the present invention includes the steps of: forming an intrinsic base region made of SiGe mixed crystal doped with a first impurity of a given conductivity type on a collector region made of a Si semiconductor layer; forming an emitter region made of a Si semiconductor layer on the intrinsic base region; forming an external base region doped with the first impurity in a higher concentration than the intrinsic base region by further doping a portion of the intrinsic base region with the first impurity; and further doping the external base region with a second impurity, wherein the first impurity is smaller in atomic radius than Si, and the second impurity is larger in atomic radius than Si.

In a preferred embodiment, the first impurity may be boron, and the second impurity may be an element selected from the group consisting of Ge, In, Ga and Al.

According to the heterojunction bipolar transistor and the fabrication method for the same of the present invention, the external base region doped with the first impurity smaller in atomic radius than Si in high concentration is further doped with the second impurity larger in atomic radius than Si. By this doping, tensile stress produced in the external base region can be relaxed or eliminated. Thus, a heterojunction bipolar transistor excellent in speedup characteristic that can prevent decrease in the lattice distortion amount existing in the intrinsic base region can be implemented stably.

DESCRIPTION OF THE PREFERRED EMBODIMENTS

Figure 1:
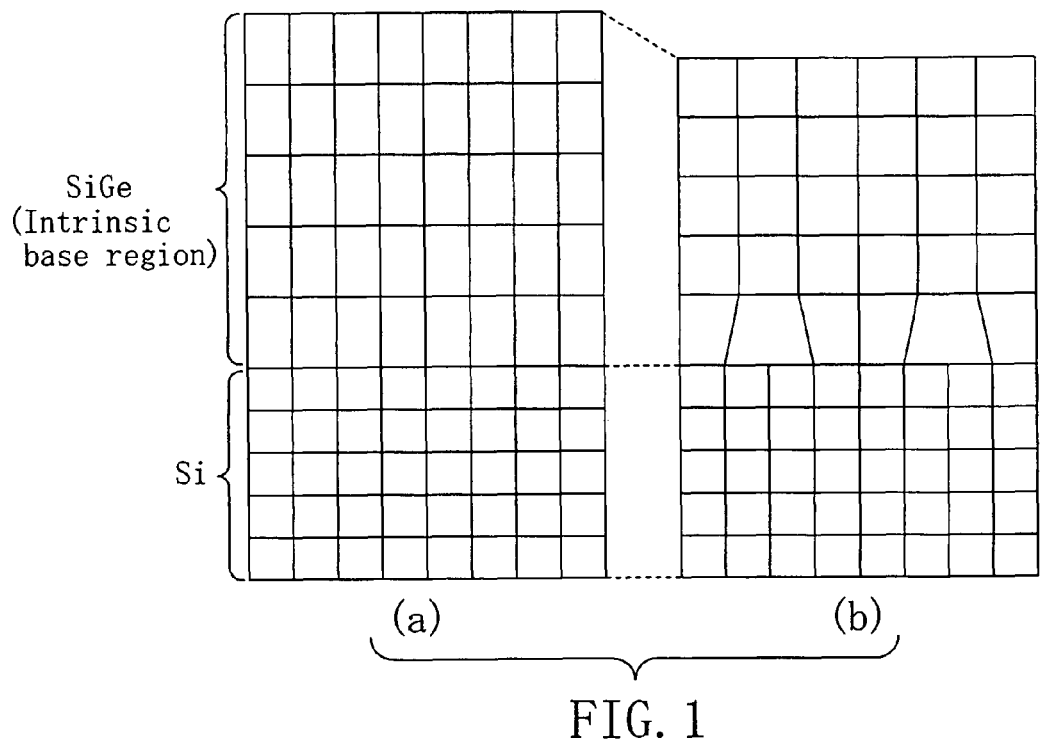
FIG. 1 is a diagram illustrating decrease in the lattice distortion amount existing in an intrinsic base region according to the present invention.

Hereinafter, preferred embodiments of the present invention will be described with reference to the accompanying drawings. It should be noted that for simplification of description, components having substantially the same functions are denoted by the same reference numerals throughout the drawings. Note also that the present invention is not limited to the embodiments to follow.

Embodiment 1

Figure 3:
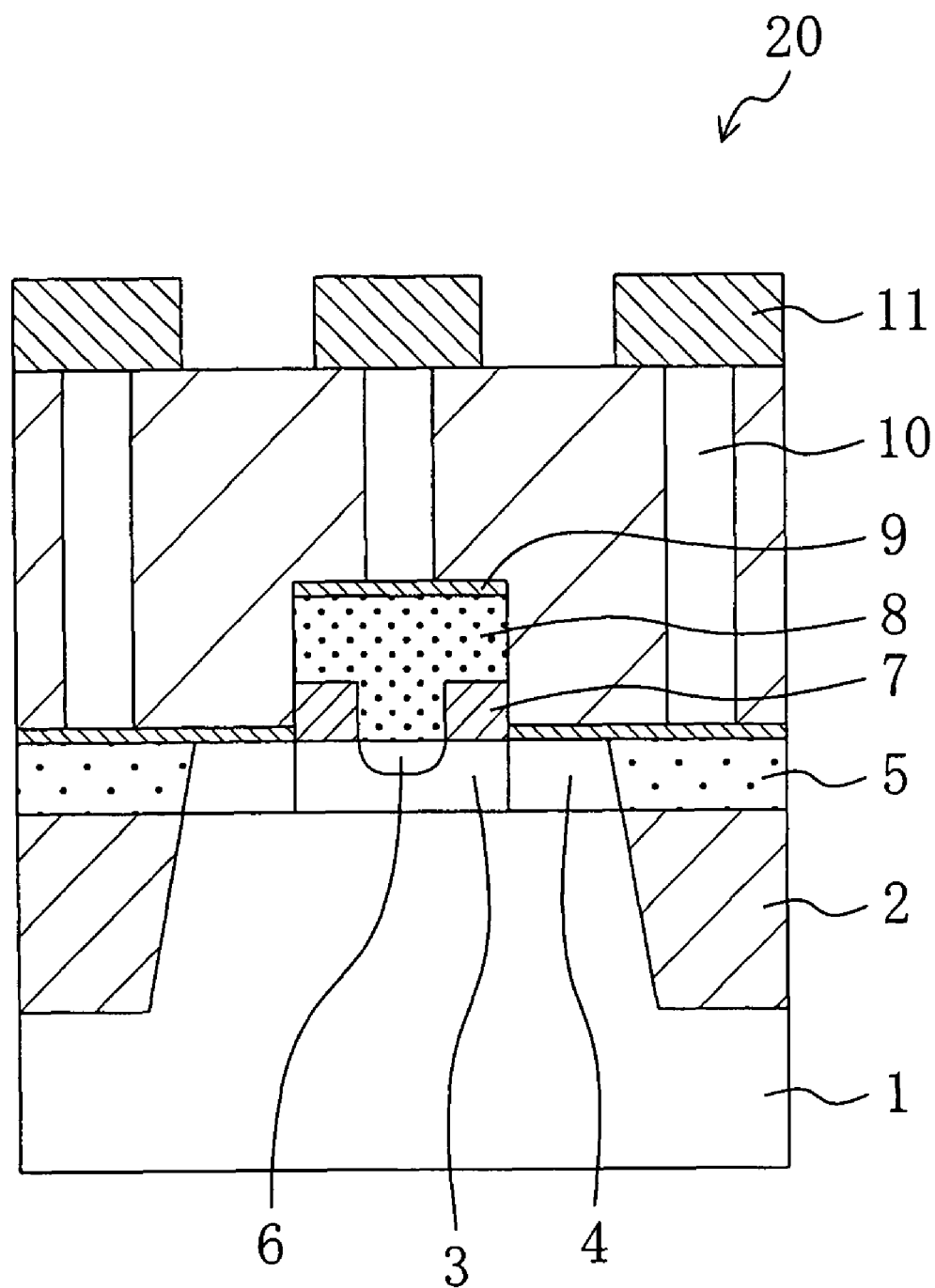
FIG. 3 is a diagrammatic cross-sectional view of a heterojunction bipolar transistor of Embodiment 1 of the present invention.
Figure 6:
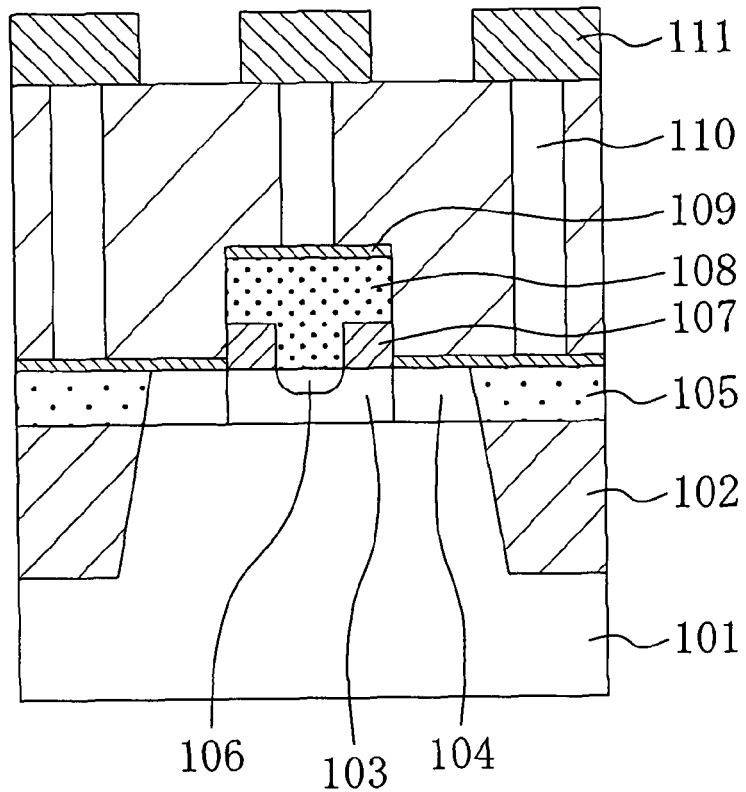
FIG. 6 is a diagrammatic cross-sectional view of a conventional heterojunction bipolar transistor.

FIG. 3 is a diagrammatic cross-sectional view of a heterojunction bipolar transistor of Embodiment 1 of the present invention. In this embodiment, a transistor structure using polysilicon extraction electrodes suitable for speedup is adopted, and thus the basic configuration of this transistor is the same as that shown in FIG. 6.

A heterojunction bipolar transistor 20 of FIG. 3 is a SiGe-HBT having a base region made of SiGe mixed crystal, and the base region is essentially composed of an intrinsic base region 3 having junctions with a collector region 1 and an emitter region 6 and an external base region 4 for connecting the intrinsic base region 3 with a base electrode 5.

Both the intrinsic base region 3 and the external base region 4 are doped with a first impurity of a given conductivity type, and the external base region 4 is further doped with a second impurity. Note that to reduce the external base resistance, the external base region 4 is doped with the first impurity at a higher concentration (for example, $5E19$ $cm^{-3}$ or higher) than the intrinsic base region 3.

According to the present invention, as the first impurity, an element smaller in atomic radius than Si (such as boron, for example) is selected, and as the second impurity, an element larger in atomic radius than the first impurity (such as Ge, In, Ga and Al, for example) is selected.

When the external base region 4 is doped with the first impurity (for example, boron) in high concentration, the lattice constant of the SiGe mixed crystal of the external base region 4 decreases, resulting in tensile stress being exerted on the intrinsic base region 3. In this embodiment, the external base region 4 is further doped with the second impurity (for example, Ge), which acts to relax the tensile stress. Thus, the decrease in the lattice distortion amount in the intrinsic base region 3, which will otherwise occur due to the tensile stress, can be prevented.

In other words, when the external base region 4 is doped with the first impurity in high concentration, tensile stress arises on the boundary between the intrinsic base region 3 and the external base region 4 due to the difference between the concentrations of the first impurity introduced in the intrinsic base region 3 and the external base region 4. This tensile stress is relaxed with the second impurity introduced in the external base region 4.

A second impurity that is larger in atomic radius than the first impurity can provide the effect of lessening the decrease in the lattice constant of the SiGe mixed crystal in the external base region. However, if an element larger in atomic radius than Si (such as Ge, In, Ga and Al, for example) is selected as the second impurity, the second impurity itself will act to increase the lattice constant of the SiGe mixed crystal, and thus can provide even the effect of canceling the change amount of the lattice constant of the SiGe mixed crystal in the external base region 4.

The "atomic radius" as used herein refers to the radius of an atom in a molecule, a crystal and the like as being regarded as a rigid sphere. An atom larger in atomic number tends to be larger in atomic radius. It is generally known that an element larger in atomic radius is larger in the lattice constant of its crystal. For this reason, the lattice constant of the SiGe mixed crystal will become large by further doping the SiGe mixed crystal with Ge that belongs to the same group as Si and is larger in atomic radius than Si, or doping the SiGe mixed crystal with a p-type impurity such as Al, Ga and In that is larger in atomic radius than boron in place of boron.

Next, the dopant amount of the second impurity required to relax the tensile stress produced in the external base region 4, that is, compensate the reduction in the lattice constant of the SiGe mixed crystal in the external base region 4 will be described with reference to FIG. 2.

Figure 2:
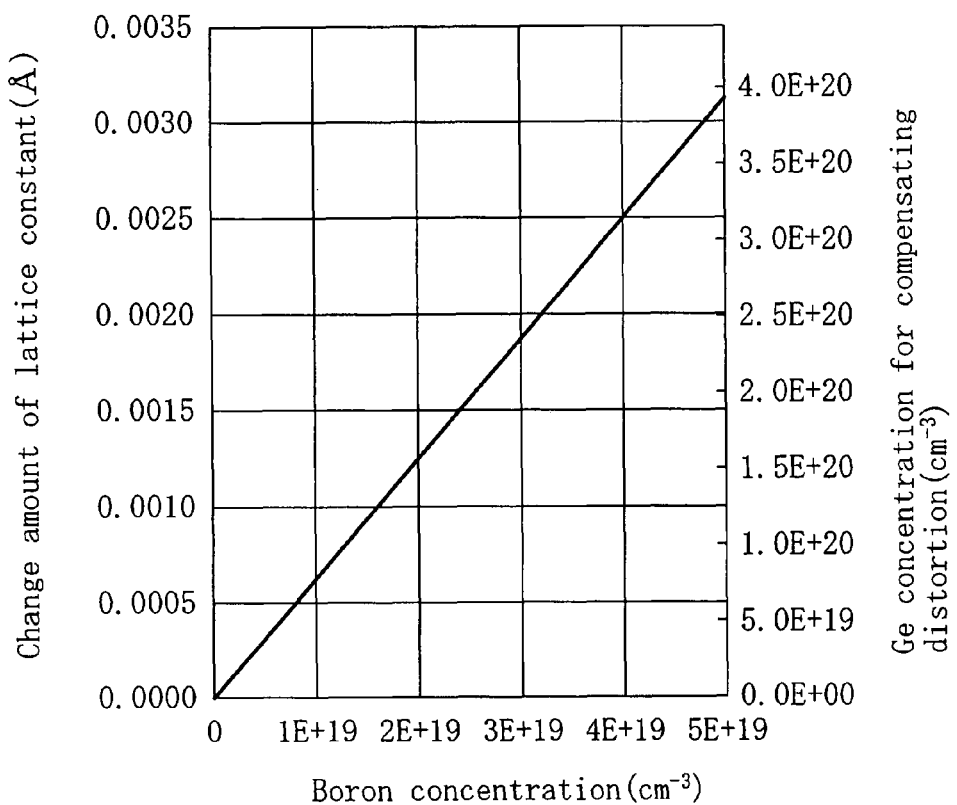
FIG. 2 is a graph showing the relationship between the boron concentration and the change amount of the lattice constant in a SiGe epitaxial film.

FIG. 2 is a graph showing the results of measurements made using the samples of the SiGe layer ($Si_{0.79}Ge_{0.21}$) epitaxially grown on the Si (100) plane, in which the change amount of the lattice constant of the SiGe layer with respect to the boron concentration introduced in the SiGe layer is plotted. This graph also has the right y-axis to plot the concentration of Ge (second impurity) required to compensate this change amount of the lattice constant.

The Ge concentration required to compensate the change amount of the lattice constant was calculated by X-ray diffraction measurement (rocking curve measurement) that is a general technique for evaluating a change in lattice constant. When the SiGe layer is doped with boron, the lattice constant of the SiGe layer becomes small because boron is smaller in atomic radius than Si, and this shifts the peak of the SiGe layer to the high angle side. When the SiGe layer is further doped with Ge, the lattice constant becomes large because Ge is larger in atomic radius than Si, and this shifts the peak of the SiGe layer to the low angle side. The change amount of the lattice constant can be determined from the amount of this shift of the SiGe peak. Since the doping concentrations of boron and Ge are available by an analysis technique such as SIMS, the relationship in FIG. 2 can be obtained from the doping concentrations of boron and Ge and the change amount of the lattice constant with the doping.

When the SiGe mixed crystal in the intrinsic base region 3 and that in the external base region 4 are respectively expressed as $Si_{(1-x1)}G_{x1}$ and $Si_{(1-x2)}G_{x2}$ for the sake of convenience (x1<x2 because the external base region is excessively doped with Ge), it can be said from the gradient of the graph in FIG. 2 that the reduction in lattice constant caused by boron in the external base region 4 will be completely cancelled if equation, $$7.5 \times (B_{ext} - B_{int}) = G_{ext} - G_{int} \quad (1)$$

is satisfied where $B_{int}$ and $B_{ext}$ are respectively the boron concentrations of the intrinsic base region 3 and the external base region 4 and $G_{int}$ and $G_{ext}$ are respectively the Ge concentration of the intrinsic base region 3 and the external base region 4.

Note however that the effect of the present invention can be sufficiently exerted as long as the amount of Ge twice or more as large as the difference in boron concentration between the intrinsic base region 3 and the external base region 4 ($B_{ext} - B_{int}$) is excessively introduced in the external base region 4.

Meanwhile, by introducing Ge in a concentration higher than the concentration with which the reduction in lattice constant caused by boron in the external base region 4 is cancelled (that is, the right term of the equation (1) is greater than the left term thereof), compressive stress may be inversely exerted on the intrinsic base region 3 by the external base region 4. With this compressive stress, the lattice distortion amount in the intrinsic base region 3 can further be increased, and thus the effect inherent in the SiGe-HBT (increase in mobility) can further be attained.

The introduction of the first impurity (boron, for example) into the external base region 4 is generally performed by ion implantation. In this case, the first impurity introduced in the external base region 4 has a concentration profile. That is, the amount of reduction in lattice constant in the external base region 4 changes with this concentration profile.

Also, the introduction of the second impurity (Ge, for example) into the external base region 4 is generally performed by ion implantation. In this case, by performing the ion implantation so that the concentration peak of the second impurity implanted in the external base region 4 is roughly coincident with the concentration peak of the first impurity implanted in the external base region 4, the reduction in lattice constant can be compensated effectively according to the change in the amount of reduction in lattice constant in the external base region 4.

Next, a fabrication method for the heterojunction bipolar transistor 20 of this embodiment of the present invention will be described with reference to the cross-sectional views of process steps shown in FIGS. 4A to 4D and 5A to 5C.

Figure 4A:
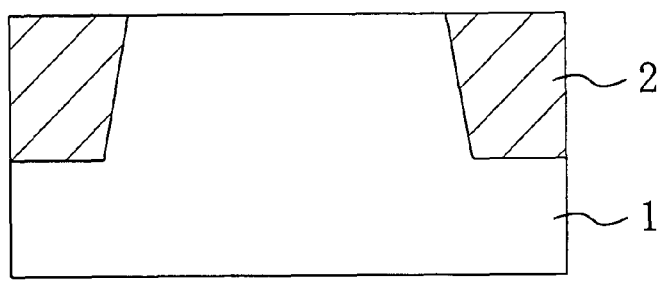
FIGS. 4A to 4D and 5A to 5C are cross-sectional views showing process steps of a fabrication method for the heterojunction bipolar transistor of Embodiment 1 of the present invention.
Figure 4B:
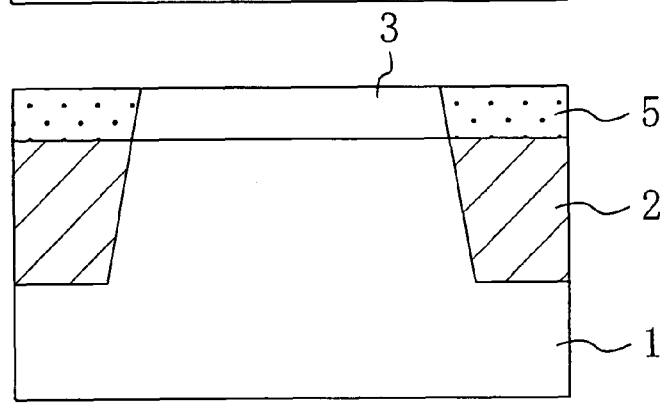

First, as shown in FIG. 4A, a Si substrate having the collector region 1 and an isolation region 2 formed therein is prepared. As shown in FIG. 4B, a SiGe epitaxial layer doped with boron (concentration: $1E19 \text{ cm}^{-3}$) is grown on the surface of the Si substrate to a thickness of about 30 nm, to form the intrinsic base region 3 and the base electrode 5. The intrinsic base region 3 forms a heterojunction with the collector region 1. The base electrode 5 formed on the isolation region 2 is polycrystalline.

Figure 4C:
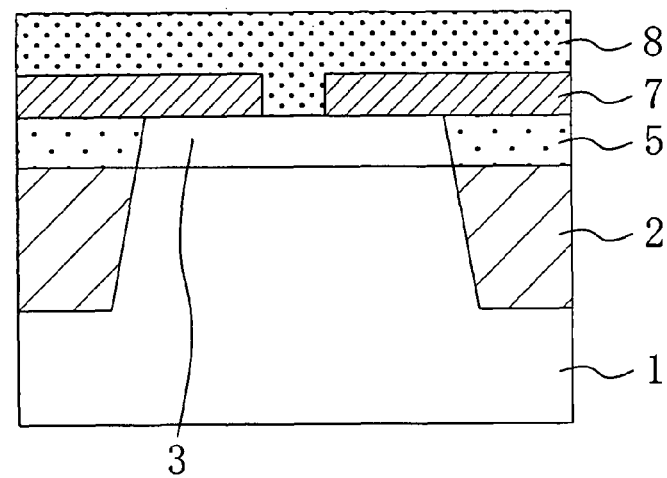

As shown in FIG. 4C, an insulating film (for example, an oxide film) 7 is formed on the SiGe epitaxial layer including the intrinsic base region 3, and a portion thereof to become an emitter region is etched off to form an opening. A polysilicon film 8 doped with phosphorus (concentration: $5E20 \text{ cm}^{-3}$) is then formed on the insulating film 7 burying the opening, to a thickness of about 300 nm.

Figure 4D:
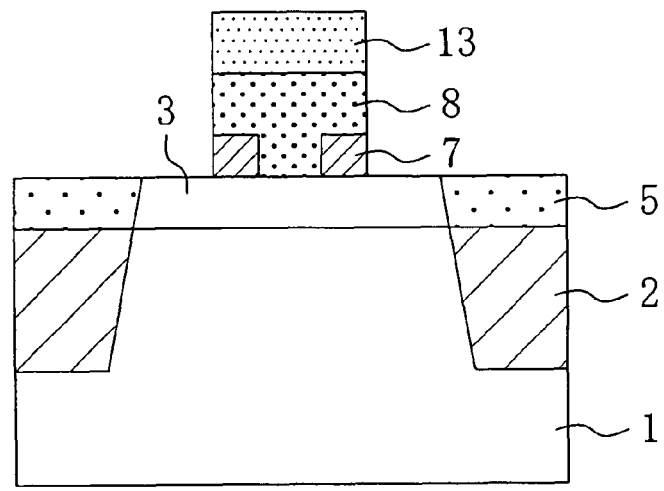

As shown in FIG. 4D, a resist mask 13 is formed on the polysilicon film 8, and using the resist mask 13 as a mask, the polysilicon film 8 and the insulating film 7 are etched to form the emitter extraction electrode 8.

Figure 5A:
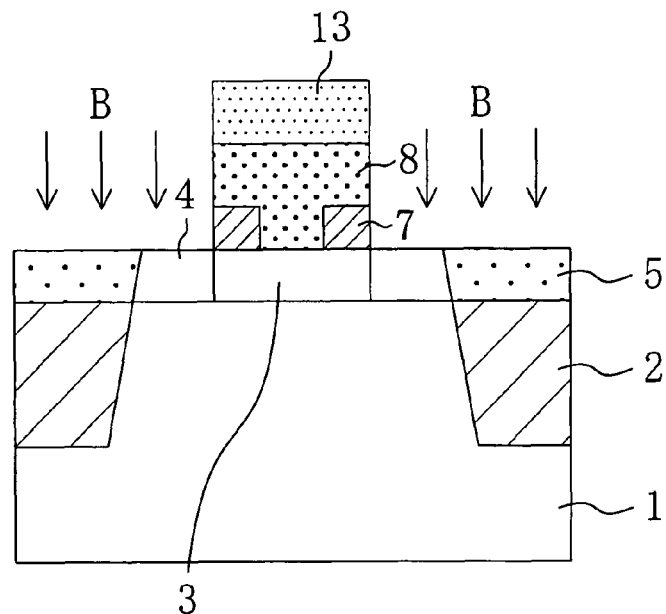

As shown in FIG. 5A, using the resist mask 13 used for the formation of the emitter extraction electrode 8 as a mask, high-concentration boron (concentration: $5E19 \text{ cm}^{-3}$) is ion-implanted in the exposed portion of the intrinsic base region 3 and the base electrode 5 to form the external base region 4 in a self-alignment manner with respect to the emitter extraction electrode 8.

Figure 5B:
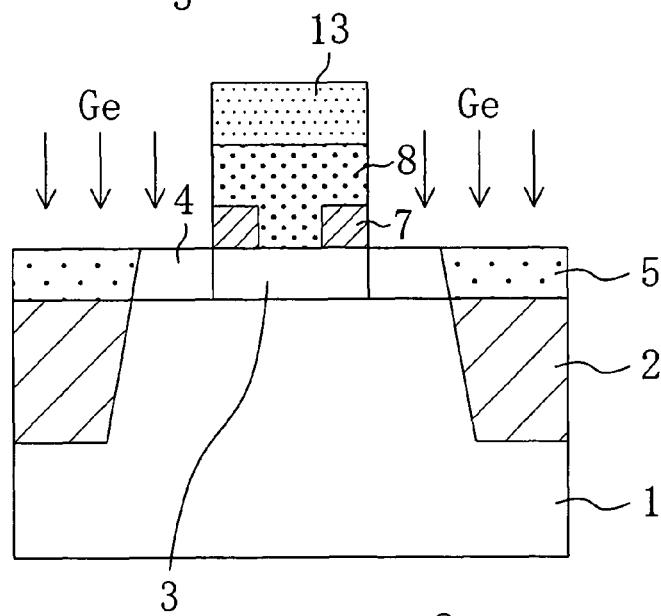

As shown in FIG. 5B, simultaneously with the boron implantation, Ge of a predetermined concentration is ion-implanted in the exposed portion of the intrinsic base region 3 using the emitter extraction electrode 8 as a mask. The concentration of Ge to be ion-implanted can be determined based on the equation (1). When the boron concentration is $5E19 \text{ cm}^{-3}$, the concentration of Ge may be set in the range of 2E20 to $5E20 \text{ cm}^{-3}$. With this setting, the effect of the present invention can be sufficiently exerted.

Figure 5C:
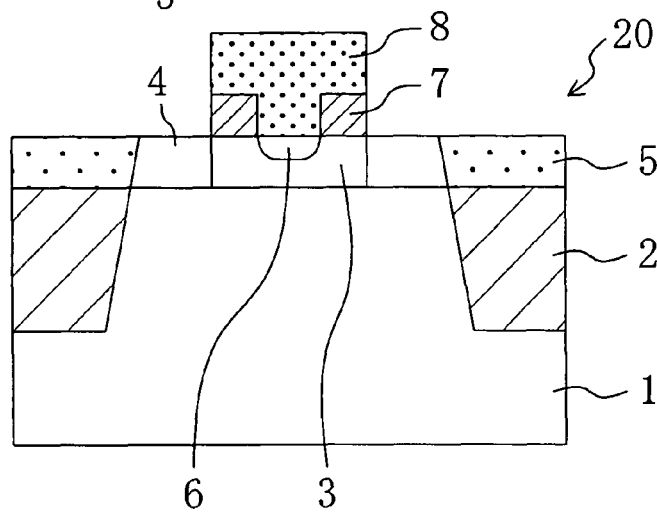

Finally, as shown in FIG. 5C, activation annealing for the ion-implanted boron is performed. Simultaneously, the phosphorus introduced in the emitter extraction electrode 8 is allowed to diffuse into the surface portion of the intrinsic base region 3 to form the emitter region 6, to thereby complete the heterojunction bipolar transistor 20.

Alteration 1 to Embodiment 1

In the above embodiment, Ge was used as the second impurity. However, Ge does not act as a p-type or n-type impurity against SiGe. Moreover, the second impurity must be introduced in the external base region 4 in the same level of concentration as the first impurity introduced in the external base region 4. In particular, when the second impurity is introduced by ion implantation, attention must be paid to occurrence of a crystal defect and the like.

Indium (In) acts as a p-type impurity, and having an atomic radius larger than Si, can be used as the second impurity according to the present invention. In view of this, both boron and In may be introduced in the external base region 4 as a p-type impurity (first impurity), to obtain both the reduction in external base resistance and the compensation of the tensile stress. This can reduce the total concentration of impurities introduced in the external base region 4. Thus, a crystal defect and the like that may occur with introduction of the second impurity can be effectively suppressed.

Alteration 2 to Embodiment 1

When the second impurity according to the present invention is introduced in the external base region 4 in high concentration, boron may diffuse at an accelerated speed due to release of interstitial silicon as described above. In view of this, it will be useful to provide a means of suppressing such accelerated-speed diffusion of boron, in addition to preventing the decrease in lattice distortion amount existing in the intrinsic base region 3 that is an object of the present invention, for providing a heterojunction bipolar transistor having stable performance.

It is known that Ge as the second impurity is easily paired up with boron (B) as the first impurity (Ge-B pair). In view of this, the Ge ion implantation may be performed at two separate times so as to have peaks of concentration profile (concentration peaks) of Ge coincident with both the concentration peak of boron as the first impurity and the boundary between the external base region 4 and the collector region 1. With this, both effects of preventing decrease in lattice distortion amount and suppressing accelerated-speed diffusion of boron can be obtained simultaneously. This is because, by forming the Ge-B pair at the boundary between the external base region 4 and the collector region 1, boron introduced in the external base region 4 is suppressed from expanding into the collector region 1 by accelerated-speed diffusion.

It is also known that carbon (C) is easily paired up with Si. In view of this, by introducing a third impurity made of carbon in the external base region 4, interstitial Si released due to the introduction of the high-concentration first impurity (for example, boron) and the second impurity (for example, Ge) in the external base region 4 can be captured with the carbon, to reduce the concentration of the interstitial Si. In this way, the accelerated-speed diffusion of boron due to the release of interstitial Si can be suppressed.

When ion implantation is adopted in the introduction of carbon in the external base region 4, it may be made so that the concentration peak of carbon is coincident with the concentration peak of the first impurity or the second impurity, to enable more effective capture of interstitial Si.

The introduction of carbon in the external base region 4 may also be made by a method in which carbon is allowed to enter the intrinsic base region 3 and the external base region 4 at the epitaxial growth thereof (in-situ doping). In this case, also, substantially the same effect as that described above can be obtained.

The amount of carbon introduced in the external base region 4 for suppressing the accelerated-speed diffusion of boron may be about 0.05 at % to 0.5 at %. With this range of amount, the effect can be sufficiently exerted.

Embodiment 2

The present invention was brought based on the findings that the lattice distortion amount in the intrinsic base region 3 decreases because of the tensile stress exerted on the intrinsic base region 3 by the highly doped external base region 4. In this relation, the highly doped external base region 4 also exerts tensile stress on the collector region 1.

Conventionally, the accelerated-speed diffusion of boron introduced in the external base region 4 during activation annealing was thought to occur because a large amount of interstitial Si was produced due to a damage caused by ion implantation of high-concentration boron. In this case, since boron diffuses at an accelerated speed in the direction of depth of the substrate, the external base resistance becomes deep, and as a result, the transistor characteristics vary with increase in base parasitic capacitance and the like.

Figure 7:
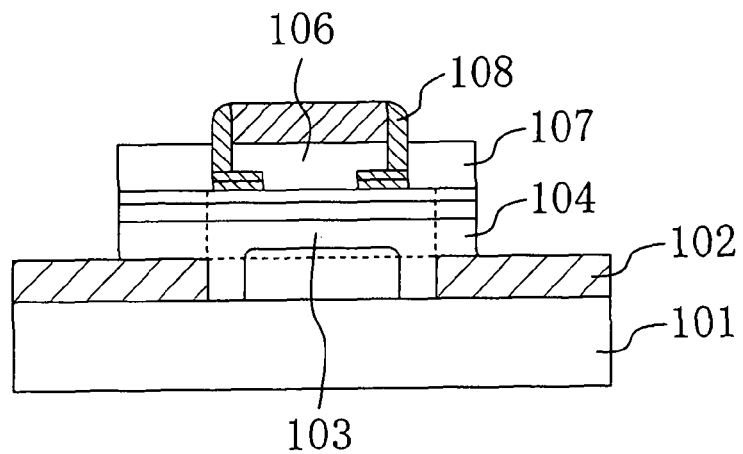
FIG. 7 is a diagrammatic cross-sectional view of another conventional heterojunction bipolar transistor.

However, even when a raised base structure as shown in FIG. 7 was adopted to diffuse boron from doped polysilicon, not by ion implantation, the degradation in transistor characteristics, which was considered caused by accelerated-speed diffusion, was often observed. In particular, not only the increase in base parasitic capacitance, but also a variation in $h_{FE}$ and the like were observed. From this, it is expected that boron diffuses at an accelerated speed, not only in the direction of depth of the substrate, but also in the lateral direction (with the diffusion in this direction, the distance between the emitter region 6 and the external base region 4 is probably shortened, and this is considered to cause a variation in $h_{FE}$).

The present inventor have judged that such accelerated-speed diffusion must have been caused by tensile stress existing on the boundary between the highly doped external base region 4 and the collector region 1 and the boundary between the external base region 4 and the intrinsic base region 3, and based on this judgment, hit upon the invention in this embodiment.

That is, in consideration that the tensile stress existing on the boundary between the external base region 4 and the collector region 1 and the boundary between the external base region 4 and the intrinsic base region 3 was produced with the reduction in the lattice constant of the external base region caused by the existence of the p-type impurity (first impurity) smaller in atomic radius than Si, the invention in this embodiment includes further doping the external base region with an impurity (second impurity) larger in atomic radius than Si to compensate the reduction in lattice constant and thus relax the tensile stress. With this doping, the accelerated-speed diffusion of the first impurity (boron) in the external base region can be effectively prevented, and thus a high-performance bipolar transistor can be implemented.

Note that since the second impurity adopted in this embodiment has commonality with the second impurity adapted in Embodiment 1 (SiGe-HBT), the effect of preventing accelerated-speed diffusion of the first impurity (for example, boron) in the external base region 4 is also exerted simultaneously in Embodiment 1. Note also that this effect is effective not only for the SiGe-HBT, but also for a normal bipolar transistor having a base region made of a Si semiconductor layer.

The bipolar transistor of Embodiment 2 of the present invention can adopt a transistor structure using polysilicon extraction electrodes suitable for speedup like the SiGe-HBT shown in FIG. 3. Hereinafter, the configuration of the bipolar transistor of Embodiment 2 of the present invention will be described with reference to FIG. 3.

A base region made of a Si semiconductor layer is essentially composed of the intrinsic base region 3 having junctions with the collector region 1 and the emitter region 6 and the external base region 4 for connecting the intrinsic base region 3 with the base electrode 5. The intrinsic base region 3 and the external base region 4 are doped with the first impurity of a given conductivity type, and the external base region 4 is further doped with the second impurity. To reduce the external base resistance, the external base region 4 is doped with the first impurity in a higher concentration (for example, 5E19 cm$^{-3}$ or higher) than the intrinsic base region 3.

According to the present invention, as the first impurity, an element smaller in atomic radius than Si (such as boron, for example) is selected, and as the second impurity, an element larger in atomic radius than Si (such as Ge, In, Ga and Al, for example) is selected.

When the external base region 4 is doped with the first impurity in high concentration, the lattice constant of the SiGe mixed crystal of the external base region 4 decreases, and this causes the external base region 4 to exert tensile stress on the collector region 1. However, the second impurity further introduced in the external base region 4 acts to relax the tensile stress. In this way, accelerated-speed diffusion of the first impurity caused by the tensile stress can be prevented.

While the present invention has been described in preferred embodiments, it will be apparent to those skilled in the art that the invention is not limited to these embodiments but the disclosed invention may be modified in numerous ways. For example, in Embodiment 1, Ge was introduced in the external base region 4 by ion implantation. Instead, the external base region 4 may be formed by epitaxially growing a SiGe layer including Ge in a larger proportion than in the intrinsic base region 3. In this case, the external base region 4 will be formed by first forming the intrinsic base region 3 by epitaxy, etching off the portion thereof that is to be the external base region 4, and then growing a SiGe layer again by selective epitaxy.

What is claimed is:

1. A heterojunction bipolar transistor having a base region made of SiGe mixed crystal, wherein:
   the base region includes: an intrinsic base region having junctions with a collector region and an emitter region; and an external base region for connecting the intrinsic base region with a base electrode,
   the intrinsic base region and the external base region are doped with a first impurity of a given conductivity type, and the external base region is doped with the first impurity in a higher concentration than the intrinsic base region,
   the external base region is further doped with a second impurity, and the concentration of the second impurity in the intrinsic base region is different from the concentration of the second impurity in the external base region,
   the first impurity is smaller in atomic radius than Si,
   the second impurity is larger in atomic radius than Si,
   the second impurity is made of Ge,
   the first impurity is made of boron,
   the intrinsic base region is made of SiGe mixed crystal having a composition of $Si_{(1-x1)}Ge_{x1}$,
   the external base region is made of SiGe mixed crystal having a composition of $Si_{(1-x2)}Ge_{x2}$, where $x1<x2$, and
   the Ge concentration of the external base region satisfies $$7.5 \times (B_{ext} - B_{int}) = G_{ext} - G_{int}$$

where $B_{ext}$ and $B_{int}$ respectively denote the boron concentrations of the external base region and the intrinsic base region, and $G_{int}$ and $G_{ext}$ are respectively the Ge concentration of the intrinsic base region and the external base region.

2. The heterojunction bipolar transistor of claim 1, wherein the concentration of the first impurity introduced in the external base region is 5E19 cm$^{-3}$ or higher.

3. The heterojunction bipolar transistor of claim 1, wherein tensile stress exists on the boundary between the intrinsic base region and the external base region due to a difference between the concentrations of the first impurity introduced in the intrinsic base region and the external base region, and the tensile stress is relaxed with the second impurity introduced in the external base region.

4. The heterojunction bipolar transistor of claim 1, wherein a concentration peak of the second impurity in the external base region is roughly coincident with a concentration peak of the first impurity in the external base region.

5. The heterojunction bipolar transistor of claim 4, wherein another concentration peak of the second impurity in the external base region is located at the boundary between the external base region and the collector region.

6. The heterojunction bipolar transistor of claim 1, wherein the external base region is further doped with a third impurity made of carbon.

7. The heterojunction bipolar transistor of claim 6, wherein a concentration peak of the third impurity made of carbon in the external base region is roughly coincident with a concentration peak of the first impurity in the external base region.

8. The heterojunction bipolar transistor of claim 1, wherein the SiGe mixed crystal includes SiGeC.

* * * * *